United States Patent
Dai et al.

(10) Patent No.: US 12,085,858 B2
(45) Date of Patent: Sep. 10, 2024

(54) PHOTORESIST PATTERNING PROCESS

(71) Applicant: Applied Materials, Inc., Santa Clara, CA (US)

(72) Inventors: Huixiong Dai, San Jose, CA (US); Srinivas D. Nemani, Sunnyvale, CA (US); Steven Hiloong Welch, Milpitas, CA (US); Mangesh Ashok Bangar, San Jose, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 290 days.

(21) Appl. No.: 16/825,388

(22) Filed: Mar. 20, 2020

(65) Prior Publication Data

US 2021/0294215 A1    Sep. 23, 2021

(51) Int. Cl.
| | | |
|---|---|---|
| *G03F 7/20* | (2006.01) | |
| *G03F 7/16* | (2006.01) | |
| *G03F 7/38* | (2006.01) | |
| *H01L 21/027* | (2006.01) | |
| *H01L 21/266* | (2006.01) | |
| *H01L 21/311* | (2006.01) | |

(52) U.S. Cl.
CPC .............. *G03F 7/20* (2013.01); *G03F 7/16* (2013.01); *G03F 7/38* (2013.01); *H01L 21/0273* (2013.01); *H01L 21/266* (2013.01); *H01L 21/31133* (2013.01)

(58) Field of Classification Search
CPC ... G03F 7/203; G03F 7/11; G03F 7/38; G03F 7/0392; G03F 7/168
See application file for complete search history.

(56) References Cited

U.S. PATENT DOCUMENTS

| | | |
|---|---|---|
| 7,187,796 B1 | 3/2007 | Phan et al. |
| 9,748,148 B2 | 8/2017 | Yieh et al. |
| 2002/0123011 A1 | 9/2002 | Kawano et al. |
| 2009/0002722 A1 | 1/2009 | Hayasaki et al. |
| 2010/0203299 A1* | 8/2010 | Abdallah ............... G03F 7/40 430/296 |
| 2015/0325411 A1 | 11/2015 | Godet et al. |
| 2015/0355549 A1* | 12/2015 | Xie ....................... G03F 7/38 355/53 |

(Continued)

OTHER PUBLICATIONS

U.S. Appl. No. 16/600,101, filed Oct. 11, 2019 Entitled "A Film Structure for Electric Field Guided Photoresist Patterning Process".

(Continued)

*Primary Examiner* — Daborah Chacko-Davis
(74) *Attorney, Agent, or Firm* — Patterson + Sheridan, LLP

(57) ABSTRACT

A method for enhancing a photoresist profile control includes applying a photoresist layer comprising a photoacid generator on an underlayer disposed on a material layer, exposing a first portion of the photoresist layer unprotected by a photomask to light radiation in a lithographic exposure process, providing a thermal energy to the photoresist layer in a post-exposure baking process, applying an electric field or a magnetic field while performing the post-exposure baking process, and drifting photoacid from the photoresist layer to a predetermined portion of the underlayer under the first portion of the photoresist layer.

8 Claims, 8 Drawing Sheets

(56) References Cited

U.S. PATENT DOCUMENTS

| | | |
|---|---|---|
| 2016/0329222 A1 | 11/2016 | Xie et al. |
| 2018/0102282 A1 | 4/2018 | Krysak et al. |
| 2018/0164689 A1 | 6/2018 | Sano et al. |
| 2020/0161181 A1 | 5/2020 | Wang et al. |

OTHER PUBLICATIONS

U.S. Appl. No. 16/825,393, filed Mar. 20, 2020 Entitled "Lithography Process Window Enhancement for Photoresist Patterning".

* cited by examiner

PHOTORESIST PATTERNING PROCESS

BACKGROUND

Field

The present disclosure generally relates to methods and apparatuses for processing a substrate, and more specifically to methods and apparatuses for enhancing photoresist profile control.

Description of the Related Art

Integrated circuits have evolved into complex devices that can include millions of components (e.g., transistors, capacitors, and resistors) on a single chip. Photolithography may be used to form components on a chip. Generally the process of photolithography involves a few basic stages. Initially, a photoresist layer is formed on a substrate. The photoresist layer may be formed by, for example, spin-coating. The photoresist layer may include a resist resin and a photoacid generator. The photoacid generator, upon exposure to electromagnetic radiation in a subsequent exposure stage, alters the solubility of the photoresist in the development process. Excess solvent may be removed in a pre-exposure bake process.

In the exposure stage, a photomask or reticle may be used to selectively expose certain regions of a photoresist layer disposed on the substrate to electromagnetic radiation. Other exposure methods may be maskless exposure methods. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Exposure to the electromagnetic radiation may decompose the photoacid generator, which generates acid and results in a latent acid image in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

After the post-exposure bake, the substrate, and, particularly, the photoresist layer may be developed and rinsed. After development and rinsing, a patterned photoresist layer is then formed on the substrate, as shown in FIG. 1. FIG. 1 depicts an exemplary orthogonal sectional view of the substrate 100 having a patterned photoresist layer 104 disposed on a target material 102 to be etched. Openings 106 are defined between the patterned photoresist layer 104, after the development and rinse processes, exposing the underlying target material 102 for etching to transfer features onto the target material 102. However, inaccurate control or low resolution of the lithography exposure process may not retain critical dimensions of the photoresist layer 104, resulting in an unacceptable line width roughness 108. Furthermore, during the exposure process, acid (as shown in FIG. 1) generated from the photoacid generator may randomly diffuse to any region, including the regions protected under the mask unintended to be diffused, thus creating undesired wiggling or roughness profile 150 at the edge or interface of the patterned photoresist layer 104 interfaced with the openings 106. Large line width roughness 108 and undesired wiggling profile 150 of the photoresist layer 104 may result in inaccurate feature transfer to the target material 102, thus, eventually leading to device failure and yield loss.

Therefore, there is a need for a method and an apparatus to control line width roughness and enhance resolution as well as dose sensitivity so as to obtain a patterned photoresist layer with desired critical dimensions.

SUMMARY

Embodiments of the present disclosure include a method for efficient control of distribution and directionality of acid from a photoacid generator distributed in a photoresist layer during a pre- and/or post-exposure baking process so as to improve lithography resolution. In one embodiment, a method of processing a substrate includes applying a photoresist layer comprising a photoacid generator on an underlayer disposed on a material layer disposed on a substrate, exposing a first portion of the photoresist layer unprotected by a photomask to light radiation in a lithographic exposure process, providing a thermal energy to the photoresist layer in a post-exposure baking process, applying an electric field or a magnetic field while performing the post-exposure baking process or prior to exposure of the photoresist layer, and drifting photoacid from the photoresist layer into a predetermined portion of the underlayer under the first portion of the photoresist layer.

In another embodiment, a method of processing a substrate includes forming a patterned photoresist layer having openings formed therein on a substrate, performing an ion implantation process on the substrate to implant ions into a top layer exposed by the openings of the patterned photoresist layer to form a doped region in the top layer, performing a post-exposure baking process on the substrate, applying an electric field or a magnetic field while performing the post-exposure baking process, and drifting the ions in the doped region of the top layer to a predetermined region under the doped region in a bottom layer disposed under the top layer.

In yet another embodiment, a device structure includes a material layer disposed on a substrate, and a plurality of openings formed in the material layer, wherein the openings formed across the substrate have a corner angle between about 85 degrees and 95 degrees.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods for enhancing profile control of a photoresist layer formed by photolithography are provided. The diffusion of one or more of ions, electrons, charged particles and acid, generically referred to as drift species, generated by a photoacid generator during pre-exposure and/or a post-exposure bake procedure may be drifted to the nearby or underlying materials or layers so as to assist efficiently transferring features into a target layer. Electric field application controls the diffusion and distribution of the acids and/or other drift species generated by the photoacid generator in the photoresist layer, thus, efficiently altering the film properties to the nearby layers. The altered film properties of the nearby layers may serve as a hardmask layer to assist transferring features into the desired target layer. Suitable process parameters controlled during the pre- and/or post-exposure bake process for the electric field generation includes voltage level as well as the strength of the electric field.

Figure 2:
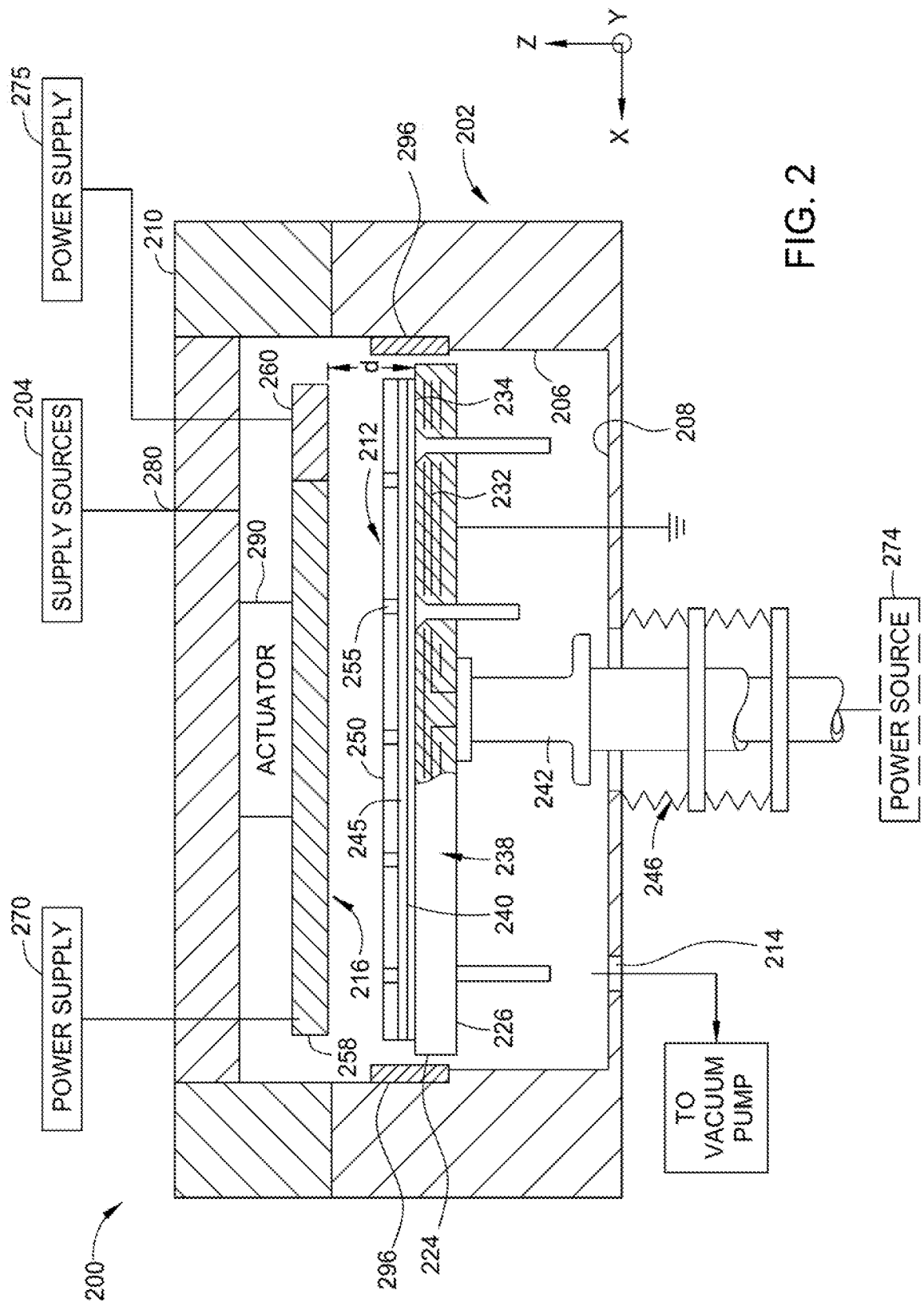
FIG. 2 is a schematic cross-sectional view of an apparatus for processing a substrate, according to one embodiment.

FIG. 2 is a schematic cross-sectional view of an apparatus for processing a substrate, according to one embodiment. As shown in the embodiment of FIG. 2, the apparatus may be in the form of a vacuum processing chamber 200. In other embodiments, the processing chamber 200 may not be coupled to a vacuum source.

The processing chamber 200 may be an independent standalone processing chamber. Alternatively, the processing chamber 200 may be part of a processing system, such as, for example, an in-line processing system, a cluster processing system, or a track processing system. The processing chamber 200 is described in detail below and may be used for a pre-exposure bake, a post-exposure bake, and/or other processing steps.

The processing chamber 200 includes chamber walls 202, an electrode assembly 216, and a substrate support assembly 238. The chamber walls 202 include sidewalls 206, a lid assembly 210, and a bottom 208. The chamber walls 202 partially enclose a processing volume 212. The processing volume 212 is accessed through a substrate transfer port (not shown) configured to facilitate movement of a substrate 240 into and out of the processing chamber 200. In embodiments where the processing chamber 200 is part of a processing system, the substrate transfer port may allow for the substrate 240 to be transferred to and from an adjoining transfer chamber.

A pumping port 214 may optionally be disposed through one of the lid assembly 210, sidewalls 206 or bottom 208 of the processing chamber 200 to couple the processing volume 212 to an exhaust port. The exhaust port couples the pumping port 214 to various vacuum pumping components, such as a vacuum pump. The pumping components may reduce the pressure of the processing volume 212 and exhaust any gases and/or process by-products out of the processing chamber 200. The processing chamber 200 may be coupled to one or more supply sources 204 for delivering one or more source compounds into the processing volume 212.

The substrate support assembly 238 is centrally disposed within the processing chamber 200. The substrate support assembly 238 supports the substrate 240 during processing. The substrate support assembly 238 may include a body 224 that encapsulates at least one embedded heater 232. In some embodiments, the substrate support assembly 238 may be an electrostatic chuck. The heater 232, such as a resistive element, is disposed in the substrate support assembly 238. The heater 232 controllably heats the substrate support assembly 238 and the substrate 240 positioned thereon to a predetermined temperature. The heater 232 is configured to quickly ramp the temperature of the substrate 240 and to accurately control the temperature of the substrate 240. In some embodiments, the heater 232 is connected to and controlled by a power source 274. The power source 274 may alternatively or additionally apply power to the substrate support assembly 238. The power source 274 may be configured similarly to a power source 270, discussed below. Furthermore, it is noted that the heater 232 may be disposed in other locations of the processing chamber 200, such as in the chamber wall, chamber liner, edge ring that circumscribes the substrate, the chamber ceiling and the like, as needed to provide thermal energy to the substrate 240 disposed on the substrate support assembly 238

In some embodiments, the substrate support assembly 238 may be configured to rotate. In some embodiments, the substrate support assembly 238 is configured to rotate about the z-axis. The substrate support assembly 238 may be configured to continuously or constantly rotate, or the substrate support assembly 238 may be configured to rotate in a step-wise or indexing manner. For example, the substrate support assembly 238 may rotate a predetermined amount, such as 90°, 180°, or 270°, and then rotation may stop for a predetermined amount of time.

Generally, the substrate support assembly 238 has a first surface 234 and a second surface 226. The first surface 234 is opposite the second surface 226. The first surface 234 is configured to support the substrate 240. The second surface 226 has a stem 242 coupled thereto. The substrate 240 may be any type of substrate, such as a dielectric substrate, a glass substrate, a semiconductor substrate, or a conductive substrate. The substrate 240 may have a material layer 245 disposed thereon. The material layer 245 may be any desired layer. In some embodiments, the substrate 240 may have more than one material layer 245. The substrate 240 also has a photoresist layer 250 disposed over the material layer 245. The substrate 240 has been previously exposed to electromagnetic radiation in an exposure stage of a photolithography process. The photoresist layer 250 has latent image lines 255 formed therein from the exposure stage. The latent image lines 255 may be substantially parallel. In other embodiments, the latent image lines 255 may not be substantially parallel. Also as shown, the first surface 234 of the substrate support assembly 238 is separated from the electrode assembly 216 by a distance d in the z-direction. The stem 242 is coupled to a lift system (not shown) for moving the substrate support assembly 238 between an elevated processing position (as shown) and a lowered substrate transfer position. The lift system may accurately and precisely control the position of the substrate 240 in the z-direction. In some embodiments, the lift system may also be configured to move the substrate 240 in the x-direction, the y-direction, or the x-direction and the y-direction. The stem 242 additionally provides a conduit for electrical and thermocouple leads between the substrate support assembly 238 and other components of the processing chamber 200. A bellows 246 is coupled to the substrate support assembly 238 to provide a vacuum seal between the processing volume 212 and the atmosphere outside the processing chamber 200 and facilitate movement of the substrate support assembly 238 in the z-direction.

The lid assembly 210 may optionally include an inlet 280 through which gases provided by supply sources 204 may enter the processing chamber 200. The supply sources 204 may optionally controllably pressurize the processing volume 212 with a gas, such as nitrogen, argon, helium, other gases, or combinations thereof. The gases from the supply sources 204 may create a controlled environment within the processing chamber 200. An actuator 290 may be optionally coupled between the lid assembly 210 and the electrode assembly 216. The actuator 290 is configured to move the electrode assembly 216 in one or more of the x, y, and z directions. The x and y directions are referred to herein as the lateral directions or dimensions. The actuator 290 enables the electrode assembly 216 to scan the surface of the substrate 240. The actuator 290 also enables the distance d to be adjusted. In some embodiments the electrode assembly 216 is coupled to the lid assembly 210 by a fixed stem (not shown). In other embodiments, the electrode assembly 216 may be coupled to the inside of the bottom 208 of the processing chamber 200, to the second surface 226 of the substrate support assembly 238, or to the stem 242. In still other embodiments, the electrode assembly 216 may be embedded between the first surface 234 and the second surface 226 of the substrate support assembly 238.

The electrode assembly 216 includes at least a first electrode 258 and a second electrode 260. As shown, the first electrode 258 is coupled to the power source 270, and the second electrode 260 is coupled to an optional power supply 275. In other embodiments, one of the first electrode 258 and the second electrode 260 may be coupled to a power supply and the other electrode may be coupled to a ground. In some embodiments, the first electrode 258 and the second electrode 260 are coupled to a ground, and the power source 274 that delivers power to the substrate support is a bipolar power supply that switches between a positive and negative bias. In some embodiments, the power source 270 or the power supply 275 may be coupled to both the first electrode 258 and the second electrode 260. In other embodiments, the power source 270 or the power supply 275 may be coupled to the first electrode 258, the second electrode 260, and the substrate support assembly 238. In such embodiments, the pulse delay to each of the first electrode 258, the second electrode 260, and the substrate support assembly 238 may be different. The electrode assembly 216 may be configured to generate an electric field parallel to the x-y plane defined by the first surface of the substrate support assembly 238. For example, the electrode assembly 216 may be configured to generate an electric field in one of the y direction, x direction or other direction in the x-y plane.

The power source 270 and the power supply 275 are configured to supply, for example, between about 500 V and about 100 kV to the electrode assembly 216, to generate an electric field having a strength between about 0.1 MV/m and about 100 MV/m. In some embodiments, the power source 274 may also be configured to provide power to the electrode assembly 216. In some embodiments, any or all of the power source 270, the power source 274, or the power supply 275 are a pulsed direct current (DC) power supply. The pulsed DC wave may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or all of the power source 270, the power source 274, and the power supply 275 are an alternating current power supply. In other embodiments, any or all of the power source 270, the power source 274, and the power supply 275 are a direct current power supply.

In some embodiments, any or all of the power source 270, the power source 274, and the power supply 275 may use a DC offset. The DC offset may be, for example, between about 0% and about 75% of the applied voltage, such as between about 5% and about 60% of the applied voltage. In some embodiments, the first electrode 258 and the second electrode 260 are pulsed negatively while the substrate support assembly 238 is also pulsed negatively. In these embodiments, the first electrode 258 and the second electrode 260 and the substrate support assembly 238 are synchronized but offset in time. For example, the first electrode 258 may be at the "one" state while the substrate support assembly is at the "zero" state, then the substrate support assembly 238 may be at the "one" state while the first electrode 258 is at the "zero" state.

The electrode assembly 216 spans approximately the width of the substrate support assembly 238. In other embodiments, the width of the electrode assembly 216 may be less than that of the substrate support assembly 238. For example, the electrode assembly 216 may span between about 10% and about 80%, such as between about 20% and about 40%, the width of the substrate support assembly 238. In embodiments where the electrode assembly 216 is less wide than the substrate support assembly 238, the actuator 290 may scan the electrode assembly 216 across the surface of the substrate 240 positioned on the first surface 234 of the substrate support assembly 238. For example, the actuator 290 may scan such that the electrode assembly 216 scans the entire surface of the substrate 240. In other embodiments, the actuator 290 may scan only certain portions of the substrate 240. Alternatively, the substrate support assembly 238 may scan underneath the electrode assembly 216.

Figure 1:
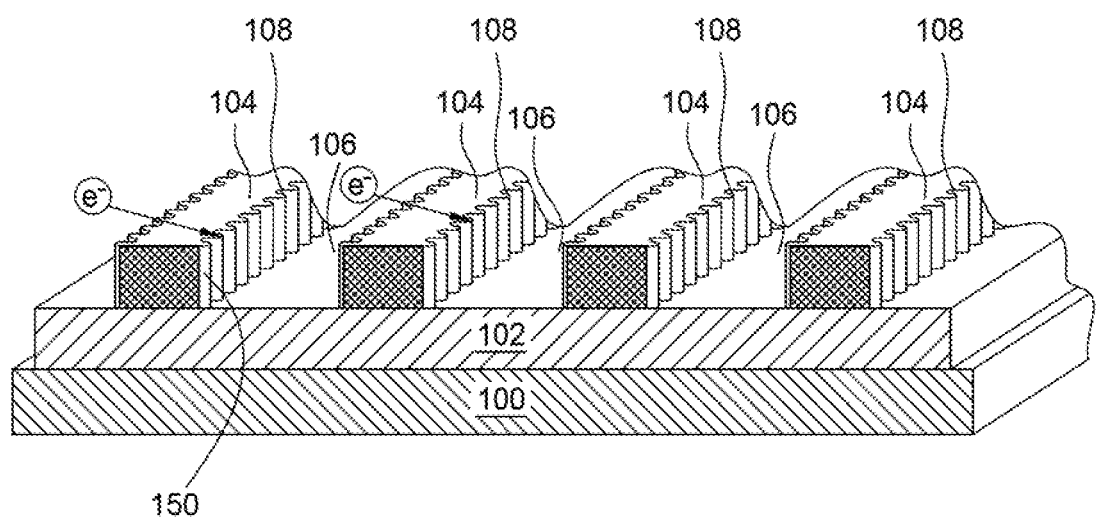
FIG. 1 depicts an orthogonal cross-sectional view of an exemplary structure of a patterned photoresist layer disposed on a substrate conventionally in the art.

In some embodiments, one or more magnets 296 may be positioned in the processing chamber 200. In the embodiment shown in FIG. 1, the magnets 296 are coupled to the inside surface of the sidewalls 206. In other embodiments, the magnets 296 may be positioned in other locations within the processing chamber 200 or outside the processing chamber 200. The magnets 296 may be, for example, permanent magnets or electromagnets. Representative permanent magnets include ceramic magnets and rare earth magnets. In embodiments where the magnets 296 include electromagnets, the magnets 296 may be coupled to a power source (not shown). The magnets 296 are configured to generate a magnetic field in a direction perpendicular or parallel to the direction of the electric field lines generated by the electrode assembly 216 at the first surface 234 of the substrate support assembly 238. For example, the magnets 296 may be configured to generate a magnetic field in the x-direction when the electric field generated by the electrode assembly 216 is in the y-direction. The magnetic field drives a charged species 355 (shown in FIG. 3) and polarized species (not shown) generated by the photoacid generators in the photoresist layer 250 in a direction perpendicular to the magnetic field, such as the direction parallel with the latent image lines 255. By driving the charged species 355 and polarized species in a direction parallel with the latent image lines 255, the line profile of the exposed photoresist layer may be controlled. The uniform directional and/or controlled movement of the charged species 355 and polarized species is shown by a double headed arrow 370 in FIG. 3. In contrast, when a magnetic field is not applied, the charged species 355 and polarized species may move randomly, as shown by arrows 370'.

Figure 3:
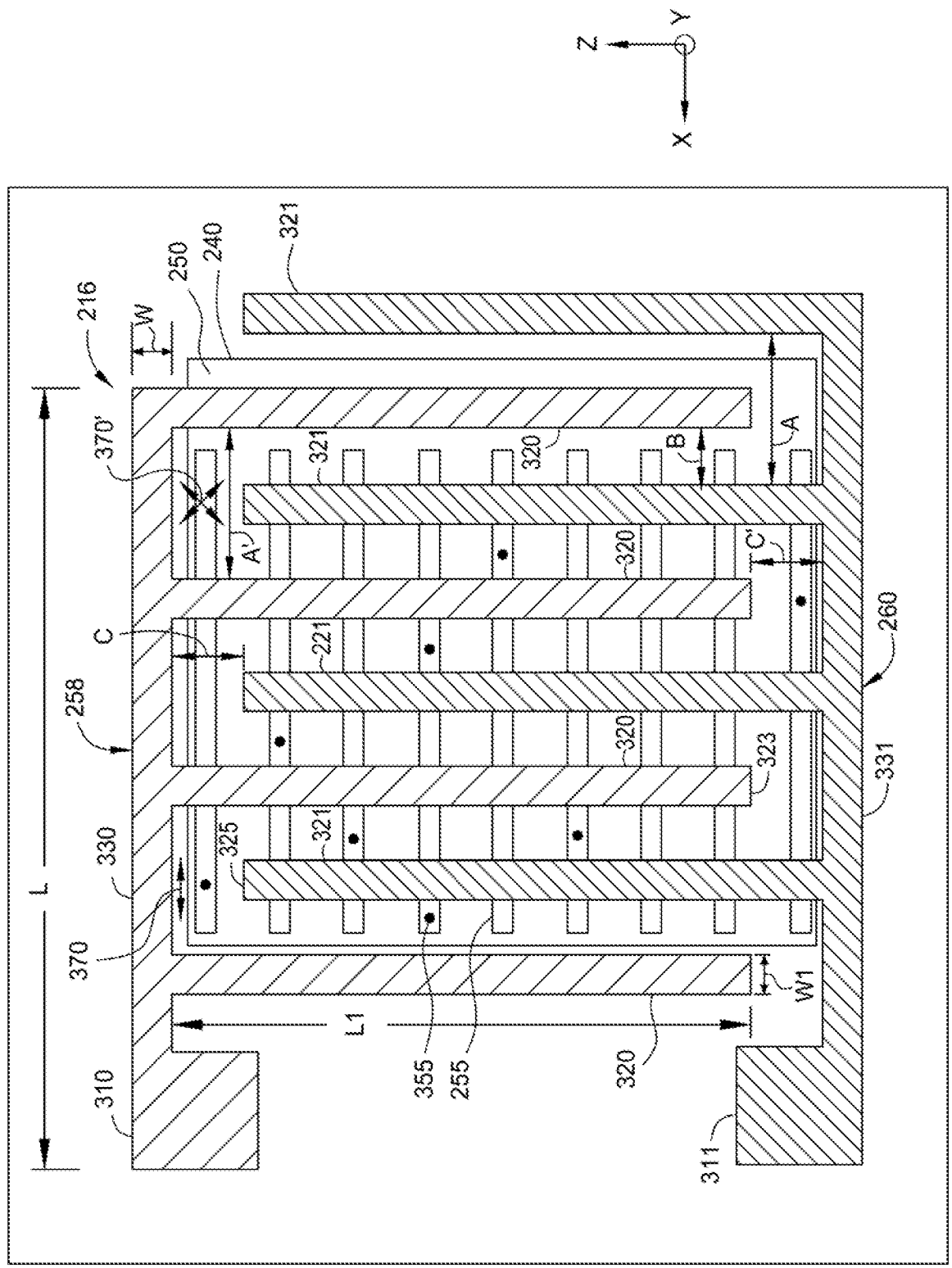
FIG. 3 is a top cross-sectional view of one embodiment of an electrode assembly disposed in the apparatus of FIG. 2.

Continuing to refer to FIG. 3, the electrode assembly 216 includes at least the first electrode 258 and the second electrode 260. The first electrode 258 includes a first terminal 310, a first support structure 330, and one or more antennas 320. The second electrode 260 includes a second terminal 311, a second support structure 331, and one or more antennas 321. The first terminal 310, the first support structure 330, and the one or more antennas 320 of the first electrode 258 may form a unitary body. Alternatively, the first electrode 258 may include separate portions that may be coupled together. For example, the one or more antennas 320 may be detachable from the first support structure 330. The second electrode 260 may similarly be a unitary body or be comprised of separate detachable components. The first electrode 258 and the second electrode 260 may be fabricated by any suitable technique. For example, the first electrode 258 and the second electrode 260 may be fabricated by machining, casting, or additive manufacturing.

The first support structure 330 may be made from a conductive material, such as a metal or other suitable material. For example, the first support structure 330 may be made of silicon, polysilicon, silicon carbide, molybdenum, aluminum, copper, graphite, silver, platinum, gold, palladium, zinc, other materials, or mixtures thereof. The first support structure 330 may have any desired dimensions. For example, the length L of the first support structure 330 may be between about 25 mm and about 450 mm, for example, between about 100 mm and about 300 mm. In some embodiments, the first support structure 330 has a length L approximately equal to a diameter of a standard semiconductor substrate. In other embodiments, the first support structure 330 has a length L that is larger or smaller than the diameter of a standard semiconductor substrate. For example, in different representative embodiments, the length L of the first support structure 330 may be about 25 mm, about 51 mm, about 76 mm, about 100 mm, about 150 mm, about 200 mm, about 300 mm, or about 450 mm. The width W of the first support structure 330 may be between about 2 mm and about 25 mm. In other embodiments, the width W of the first support structure 330 is less than about 2 mm. In other embodiments, the width W of the first support structure 330 is greater than about 25 mm. The thickness of the first support structure 330 may be between about 1 mm and about 10 mm, such as between about 2 mm and about 8 mm, such as about 5 mm. In some embodiments, the first support structure 330 may be square, cylindrical, rectangular, oval, or other shape. Embodiments having curved exterior surfaces may avoid arcing.

The second support structure 331 may be made of the same materials as the first support structure 330. The range of dimensions suitable for the first support structure 330 is also suitable for the second support structure 331. In some embodiments, the first support structure 330 and the second support structure 331 are made of the same material. In other embodiments, the first support structure 330 and the second support structure 331 are made of different materials. The lengths L, widths W, and thicknesses of the first support structure 330 and the second support structure 331 may be the same or different.

The one or more antennas 320 of the first electrode 258 may also be made from a conductive material. The one or more antennas 320 may be made from the same materials as the first support structure 330. The one or more antennas 320 of the first electrode 258 may have any desired dimensions. For example, a length L1 of the one or more antennas 320 may be between about 25 mm and about 450 mm, for example, between about 100 mm and about 300 mm. In some embodiments, the one or more antennas 320 has a length L1 approximately equal to the diameter of a standard substrate. In other embodiments, the length L1 of the one or more antennas 320 may be between about 75% and 90% of the diameter of a standard substrate. A width W1 of the one or more antennas 320 may be between about 2 mm and about 25 mm. In other embodiments, the width W1 of the one or more antennas 320 is less than about 2 mm. In other embodiments, the width W1 of the one or more antennas 320 is greater than about 25 mm. The thickness of the one or more antennas 320 may be between about 1 mm and about 10 mm, such as between about 2 mm and about 8 mm. The one or more antennas 320 may have a cross-section that is square, rectangular, oval, circular, cylindrical, or another shape. Embodiments having round exterior surfaces may avoid arcing.

Each of the antennas 320 may have the same dimensions. Alternatively, some of the one or more antennas 320 may have different dimensions than one or more of the other antennas 320. For example, some of the one or more antennas 320 may have different lengths L1 than one or more of the other antennas 320. Each of the one or more antennas 320 may be made of the same material. In other embodiments, some of the antennas 320 may be made of a different material than other antennas 320.

The antennas 321 may be made of the same range of materials as the antennas 320. The range of dimensions suitable for the antennas 320 is also suitable for the antennas 321. In some embodiments, the antennas 320 and the antennas 321 are made of the same material. In other embodiments, the antennas 320 and the antennas 321 are made of different materials. The lengths L1, widths W1, and thicknesses of the antennas 320 and the antennas 321 may be the same or different.

The antennas 320 may include between 1 and about 40 antennas 320. For example, the antennas 320 may include between about 4 and about 40 antennas 320, such as between about 10 and about 20 antennas 320. In other embodiments, the antennas 320 may include more than 40 antennas 320. In some embodiments, each of the antennas 320 may be substantially perpendicular to the first support structure 330. For example, in embodiments where the first support structure 330 is straight, each antenna 320 may be substantially parallel to the first support structure 330. Each of the antennas 320 may be substantially parallel to each of the other antennas 320. Each of the antennas 321 may be similarly positioned with respect to the support structure 331 and each other antenna 321.

Each of the antennas 320 has a terminal end 323. Each of the antennas 321 has a terminal end 325. A distance C is defined between the first support structure 330 and the terminal end 325. A distance C' is defined between the second support structure 331 and the terminal end 323. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 321 and an adjacent one of the antennas 321. A distance A' is defined between facing surfaces of one antenna 320 and an adjacent one the antennas 320. The distances A and A' may be greater than about 6 mm. For example, the distances A and A' may be between about 6 mm and about 20 mm, such as between about 10 mm and about 15 mm. The distances A and A' between each adjacent antennas 321, 320 may be the same or different. For example, the distances A' between the first and second, second and third, and third and fourth antennas of the one or more antennas 320 may be different. In other embodiments, the distances A' may be the same.

A distance B is defined between facing surfaces of one of the antennas 320 and an adjacent one of the antennas 321. The distance B may be, for example, greater than about 1 mm. For example, the distance B may be between about 2 mm and about 10 mm, such as between about 4 mm and about 6 mm. The distance B defined between may be the same, each distance B may be different, or some distances B may be the same and some distances B may be different. Adjusting the distance B allows for easy control of the electric field strength.

The antennas 320, 321 may be oriented in an alternating arrangement above the photoresist layer 250. For example, the antennas 320 of the first electrode 258 and the antennas 321 of the second electrode 260 may be positioned such that at least one of the antennas 320 is positioned between two of the antennas 321. Additionally, at least one antenna 321 may be positioned between two of the antennas 320. In some embodiments, all but one of the antennas 320 is positioned between two of the antennas 321. In those embodiments, all but one of the antennas 321 may be positioned between two of the antennas 320. In some embodiments, the antennas 320 and the antennas 321 may each have only one antenna.

In some embodiments, the first electrode 258 has a first terminal 310, and the second electrode 260 has a second terminal 311. The first terminal 310 may be a contact between the first electrode 358 and the power source 270, the power supply 275, or a ground. The second terminal 311 may be a contact between the second electrode 260 and the power source 270, the power source 270, or a ground. The first terminal 310 and the second terminal 311 are shown as being at one end of the first electrode 258 and the second electrode 260, respectively. In other embodiments, the first terminal 310 and the second terminal 311 may be positioned at other locations on the first electrode 258 and the second electrode, respectively. The first terminal 310 and the second terminal 311 have different shapes and sizes than the first support structure 330 and the support structure 331, respectively. In other embodiments, the first terminal 310 and the second terminal 311 may have generally the same shapes and sizes as the first support structure 330 and the support structure 331, respectively.

In operation during the pre- and/or post-exposure bake process, a voltage may be supplied from a power supply, such as the power source 270, the power source 274, or the power supply 275, to the first terminal 310, the second terminal 311, and/or the substrate support assembly 238. The supplied voltage creates an electric field between each antenna of the one or more antennas 320 and each antenna of the one or more antennas 321. The electric field will be strongest between an antenna of the one or more antennas 320 and an adjacent antenna of the one or more antennas 321. The interleaved and aligned spatial relationship of the antennas 320, 321 produces an electric field in a direction parallel to the plane defined by the first surface 234 of the substrate support assembly 238. The substrate 240 is positioned on the first surface 234 such that the latent image lines 255 are parallel to the electric field lines generated by the electrode assembly 216. Since the charged species 355 are charged, the charged species 355 are affected by the electric field. The electric field drives the charged species 355 generated by the photoacid generators in the photoresist layer 250 in the direction of the electric field. By driving the charged species 355 in a direction parallel with the latent image lines 255, line edge roughness may be reduced.

The uniform directional movement is shown by the double headed arrow 370. In contrast, when a voltage is not applied to the first terminal 310 or the second terminal 311, an electric field is not created to drive the charged species 355 in any particular direction. As a result, the charged species 355 may move randomly, as shown by the arrows 370', which may result in waviness or line roughness.

Figure 4:
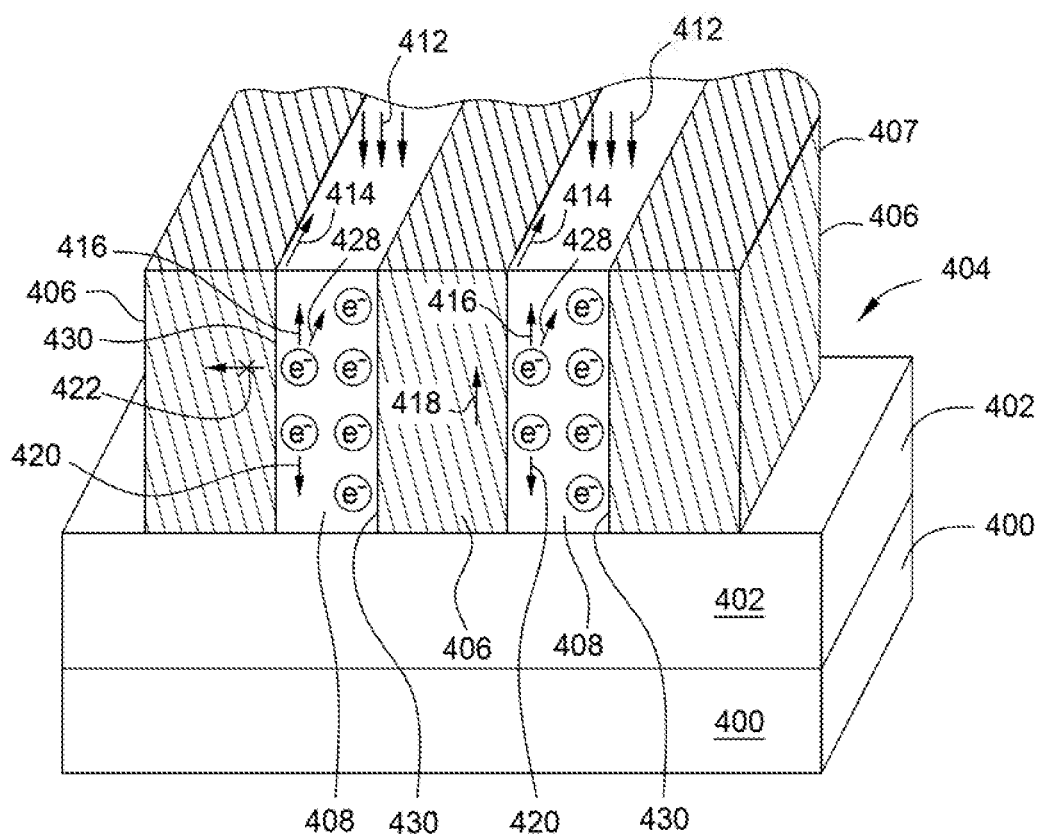
FIG. 4 depicts an acid distribution control of a photoresist layer disposed on a film structure during a post-exposure baking process.

FIG. 4 depicts a film structure 404 disposed on a substrate 400 after a lithography exposure process. A photoresist layer 407 is disposed on the film structure 404. The film structure 404 includes a target layer 402 disposed on a substrate 400. The target layer 402 is later patterned for forming the desired device features in the target layer 402. It is noted that additional layers, such as a hardmask, an underlayer, such as an organic material, an inorganic material, or a mixture of organic or inorganic materials, or other suitable materials may be disposed on the target layer 402 and below the photoresist layer 407 as needed to enhance the lithography resolution and photoresist profile control.

The photoresist layer 407 may be a positive-tone photoresist and/or a negative-tone photoresist that are capable of undergoing a chemically amplified reaction. The photoresist layer 407 is a polymer organic material.

In the embodiment wherein an underlayer (such as an underlayer 706 shown in FIG. 7A or a top layer 904 shown in FIG. 9A) or a hardmask layer (such as a hardmask layer 704 shown in FIG. 7A or a bottom layer 902 shown in FIG. 9A) is used, the underlayer may include one or more additives, such as acid agents, (e.g., photoacid generators (PAGs) or acid catalysts), base agents, adhesion promoters or photo-sensitive components. The one or more additives may be disposed in organic solvent or resin and/or an inorganic matrix material. Suitable examples of the acid agents including photoacid generators (PAGs) and/or acid catalysts may be selected from a group consisting of sulfonic acids (e.g., p-toluenesulfonic acid, styrene sulfonic acid), sulfonates (e.g., pyridinium p-toluenesulfonate, pyridinium trifluoromethanesulfonate, pyridinium 3-nitrobenzensulfonate), and mixtures thereof. Suitable organic solvent may include homo-polymers or higher polymers containing two or more repeating units and polymeric backbone. Suitable examples of the organic solvent include, but are not limited to, propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof.

In one example, the underlayer provides active acid agents, base agents, electrons, ions, or ionic/non-ionic species during the lithographic exposure process, pre-exposure baking process, or post-exposure baking process, to assist control of the photoacid flow direction from the upper photoresist layer 407.

The hardmask layer may be an anti-reflective coating (ARC) layer fabricated from a group consisting of silicon oxide, silicon nitride, silicon oxynitride, silicon carbide, amorphous carbon, doped amorphous carbon, TEOS oxide, USG, SOG, organic silicon, oxide containing material titanium nitride, titanium oxynitride, combinations thereof and the like.

As discussed above, an electric field from the electrode 216, as well as a magnetic field from the magnets 296, may be applied during one or more of the lithography exposure process, pre-exposure baking process, or post-exposure baking process, particularly, a pre-exposure baking process and/or a post-exposure baking process. In the example depicted in FIG. 4, the electric field and/or and magnetic field is applied before or after a lithography exposure process during the pre- and/or post-exposure baking process. During pre- and/or post-exposure baking process, a thermal energy is applied to the substrate 400 as well as the electric field and/or the magnetic field. Photoacid, shown as e⁻ in FIG. 4, is generated in the first region 408 in the photoresist layer 407 where the photoacid generator (PAG) therein has been exposed to light radiation 412, such as a UV light radiation, from the previous lithography exposure process. However, oftentimes, movement of photoacid are generally random and photoacid distribution may not be evenly distributed in the first region 408 or may not have a clear boundary set at the interface 430 formed in a plane (interfaced with the second region 406) defined between the first region 408 and the second region 406, resulting in a portion of photoacid drifting and diffusing into the second region 406, as shown by the arrow 422, not intended to have photoacid generation. As such, lateral photoacid movement (e.g., a direction parallel to a planar surface of the substrate 400) drifting into the second region 406, as shown by the arrow 422, may result in line edge roughness, resolution loss, photoresist footing, profile deformation, and/or narrow window for the depth of focus (DOF) during the lithography process, causing inaccurate feature transfer to the underlying target layer 402 and/or eventually leading to device failure.

Although the example discussed herein is shown as the movement of electrons from the photoacid, it is noted that any suitable species, including charges, charged particles, photons, ions, electrons, or reactive species in other forms, may also similar be caused to drift when the electric field is applied to the photoresist layer 407.

By applying an electric field and/or a magnetic field to the photoresist layer 407 during one or both of the pre- and/or post-exposure baking process, distribution and the drifting direction of photoacid in the exposed first region 408 may be efficiently redirected, controlled and confined. The electric field as applied to the photoresist layer 407 may move photoacid in a vertical direction (e.g., y direction shown by arrows 416 and 420 substantially perpendicular to the planar surface of the substrate 400) with minimal lateral motion (e.g., x direction shown by the arrow 422) without diffusing into the adjacent second region 406. Generally, photoacid may have certain polarity that may be affected by the electric field or magnetic field applied thereto, thus orienting photoacid in certain directions, and creating a desired directional movement of the photoacid in the exposed first region 408 without crossing into the adjacent protected second region 406. Furthermore, the photoresist line edge roughness, process window for the depth of focus (DOF) during the lithography process, and line critical dimension uniformity may also be well controlled, enhanced and improved when performing the pre- and/or post-exposure baking process.

In one example, the photoacid may further be controlled to move directionally at a longitudinal direction (e.g., z direction shown by arrow 428, defined in a plane interfaced with the second region 406 of the photoresist layer 407 protected by the photomask 410) along a lateral plane, as shown by arrow 414, so as to control the longitudinal distribution of photoacid confined in the exposed first region 408 without crossing in an x direction, as shown by arrow 422, into the second region 406 of the photoresist layer 407. The magnetic field generated to the photoresist layer 407 may cause the electrons to orbit along a certain magnetic line, such as the longitudinal direction (e.g., z direction shown by arrow 428) so as to further control the photoacid in a desired three-dimensional distribution. The interaction between the magnetic field and the electric field may optimize trajectory of photoacid at a certain path as desired and confined in the exposed first region 408. Furthermore, vertical photoacid movement is desired to smooth out standing waves that are naturally produced by the light exposure tool, thus enhancing exposure resolution.

In one embodiment, an electric field having a strength between about 100 MV/m and about 2000 MV/m may be applied to the photoresist layer 407, during a pre- and/or post-exposure baking process, to confine photoacid generated in the photoresist layer 407 in a vertical direction, e.g., in a y direction. In one embodiment, a magnetic field of between 5 Tesla (T) and 500 Tesla (T), along with the electric field, may be applied to the photoresist layer 407, during a pre- and/or post-exposure baking process, to confine photoacid generated in the photoresist layer 407 in both a longitudinal direction and a vertical direction, e.g., in y and z directions, with minimum lateral direction, e.g., in x direction. While exposed to the combination of the magnetic field along with the electric field, the photoacid as generated may be further confined to be distributed in the longitudinal direction, e.g., in the direction shown by the arrow 428, remaining in the first region 408 of the photoresist layer 407, parallel along the interface 430 within the exposed first region 408.

In one embodiment, the electric field and the magnetic field may be applied separately as needed. For example, the electric field applied during the pre- and/or post-exposure baking process may be controlled in a manner that can confine the movement of the photoacid at certain directions and manners. In one example, during the pre- and/or post-exposure baking process, the voltage power as supplied to generate the electric field may be controlled in a range between about 100 volts and about 5000 volts, such as between about 100 volts and about 1000 volts.

Furthermore, the voltage power as applied may be in continuous mode or in pulse mode as needed. In one example, the voltage power as applied to generate the electric field is in pulse mode. In one example, the voltage power as supplied for generating the electric field may be pulsed between about 5% and about 75% of each duty cycle. Each duty cycle, for example between each time unit, is between about 0.1 seconds and about 10 seconds, such as about 5 seconds. In one example, the frequency of the electric field as generated may be adjusted or altered at any point during the pre- and/or post-exposure baking process as needed.

Furthermore, during the pre- and/or post-exposure baking process, the thermal energy supplied to the substrate 400, and to the photoresist layer 407, may be controlled in a manner that can also assist in confining the photoacid movement in the photoresist layer 407. The thermal energy may be supplied by controlling the embedded heater 232 disposed in the substrate support assembly 238. In one example, the temperature of the substrate 400 may be controlled at between about 10 degrees Celsius (such as room temperature) and about 130 degrees Celsius, such as about 120 degrees Celsius. It is believed that the thermal energy supplied during the pre- and/or post-exposure baking process may enhance the kinetic energy or the momentum of the electrons driven by the electric and/or magnetic fields so that the control efficiency of the photoacid movement may be enhanced.

In some embodiments, the thermal energy supplied to the substrate 400 may be prior to, synchronized with, or after the time period in which the electric field and/or magnetic field are supplied. In one example, the thermal energy (e.g., turning on the heaters 232 in the substrate support assembly 238 where the substrate 400 is placed) is supplied to the substrate 400 prior to applying the electric field and/or the magnetic field to the substrate 400. It is believed that the thermal energy supplied prior to the electric field and/or the magnetic field may assist activating the electrons to an active state, so that the electrons may be relatively easier to be confined or accelerated at a predetermined moving path, thus enhancing the electrical performance of the photoresist layer during the pre- and/or post-exposure baking process, such as photon absorption efficiency, dose sensitivity, or drift directionality control. As electrons are activated and/or driven not only by the electric field/magnetic field, but also by the thermal energy, the total process time, such as the total time for performing the pre- and/or post-exposure baking process, may be reduced to a range between about 5% and about 40%, such as about 20%, less than the process time for only applying the thermal energy during the pre- and/or post-exposure baking process.

After the post-exposure baking process, an anisotropic etching process, or other suitable patterning/etching processes, may be performed to transfer features into the target layer 402 as needed.

Figure 5:
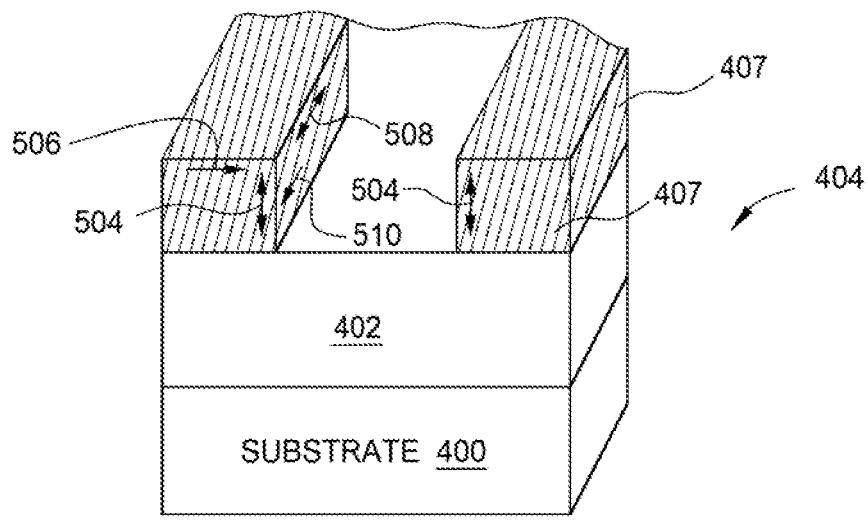
FIG. 5 depicts an acid distribution control of a photoresist layer disposed on a film structure during a post-exposure baking process.

FIG. 5 depicts another embodiment of how the electric field directionality is controlled during the pre- and/or post-exposure baking process so as to control the drifting direction of the photoacid. When an electric field and/or a magnetic field is applied to the photoresist layer 407 during the pre- and/or post-exposure baking process, distribution and the drifting direction of photoacid in the photoresist layer 407 may be efficiently redirected, controlled, and confined. The electric field as applied to the photoresist layer 407 may move photoacid in a vertical direction (e.g., y direction shown by arrow 504 substantially perpendicular to the planar surface of the substrate 400), a lateral direction 506 (e.g., x direction) or a longitudinal direction 508 (e.g., z direction) so as to control the different distributions of photoacid confined in the photoresist layer 407. The magnetic field generated to the photoresist layer 407 may cause the electrons to orbit along a certain magnetic line, such as the vertical direction, the lateral direction, or the longitudinal direction so as to further control the photoacid in a desired three-dimensional distribution as desired. The interaction between the magnetic field and the electric field may optimize trajectory of photoacid at a certain path as desired and confine the photoacid in certain areas of the photoresist layer 407. Thus, by applying the electric field and/or magnetic field during the pre- and/or post-exposure baking process, the photoacid as generated may be moved or drifted in any directions as needed and desired.

Figure 6:
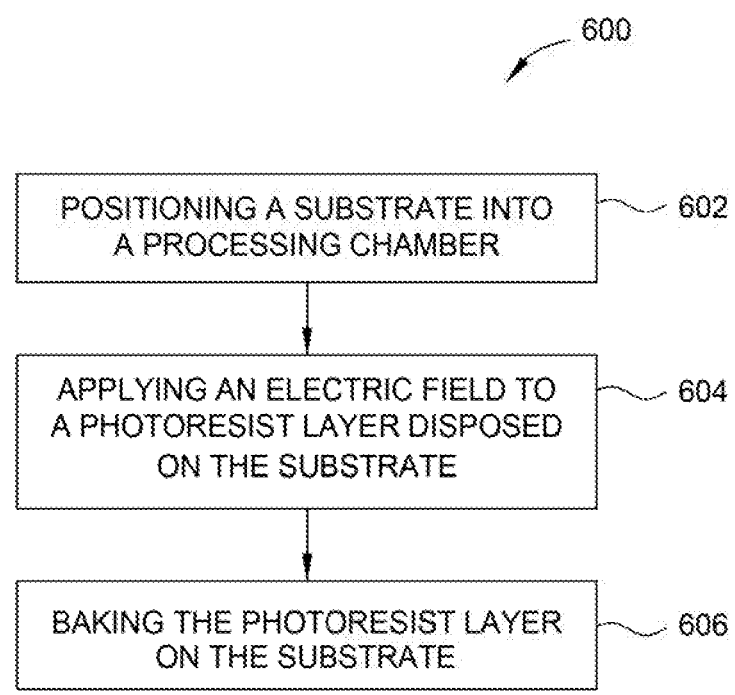
FIG. 6 is a flow diagram of one method of transferring features to a material layer disposed on a substrate.
Figure 7A:
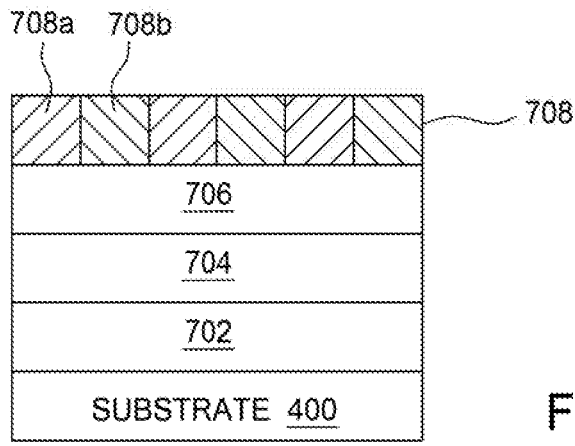
FIGS. 7A-7D are cross sectional views of a film stack disposed on a substrate during different stages of lithography process.

FIG. 6 depicts a flow diagram of a method 600 for utilizing an electric field and/or a magnetic field to assist controlling photoacid distribution/diffusion/directionality control in a photoresist layer during a pre- and/or post-exposure baking process. The method 600 begins at operation 602 by positioning a substrate, such as the substrate 400 described above, into a processing chamber, such as the processing chamber 200 depicted in FIGS. 2-3, with an electrode assembly and a magnetic assembly disposed therein. The substrate 400 has a target layer 702, a hardmask layer 704 and an underlayer 706 sequentially formed thereon, as shown in FIG. 7A. The material selection of the hardmask layer 704 and the underlayer 706 may be varied based on different lithography process requirements. In one example, the underlayer 706 and the hardmask layer 704 may be fabricated from suitable materials described above. A pre-exposure bake process is be performed prior to exposing the photoresist layer 708. During the pre-exposure bake process, energy is provided to the photoresist layer 708 by application of an electric field and/or a magnetic field as described above. The photoresist layer 708 is also heated during the pre-exposure bake process. After the exposure process, a first portion 708b of the photoresist layer 708 has been exposed to light radiation, having film properties different from the unexposed area, the second portion 708a. The first portion 708b may be later developed or removed in the following processes.

At operation 604, after the substrate 400 is positioned, an electric field and/or a magnetic field may be individually or collectively applied to the processing chamber (during at least one or more of a lithographic exposure process, pre-exposure bake process and/or post-exposure baking process) to control photoacid movement within in a photoresist layer having the underlayer 706 disposed thereunder. It is noted that the electric field and/or the magnetic field may be applied simultaneous with, prior to, or after baking the substrate 400 as needed.

After the electric field and/or a magnetic field is individually or collectively applied to the photoresist layer and the underlayer disposed on the substrate, photoacid, as generated, may move primarily in a vertical direction, a longitudinal direction, a circular direction, or any desired direction. As a result of the assistance provided by the electric field and/or a magnetic field during the post-exposure baking process, the photoacid movement in the photoresist layer may be efficiently controlled.

Figure 7B:
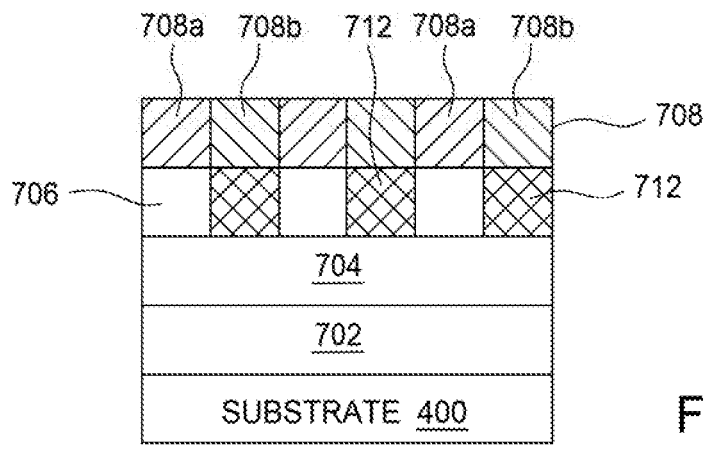

At operation 606, a thermal energy is provided to bake (e.g., cure) the photoresist layer. During the post-exposure baking process, an energy (e.g., an electric energy, thermal energy or other suitable energy) may also be provided to the photoresist layer. In one example depicted here, the energy is a thermal energy provided to the substrate during the post-exposure baking process as well as the electric field and/or the magnetic field applied at operation 604. While providing the thermal energy to the substrate, the photoacid from the first portion 708b of the photoresist layer 708 may be drifted down to the underlayer 706, forming an affected region 712 in the underlayer 706, as shown in FIG. 7B. The photoacid, quencher, ions, electron, and other charged species from the first portion 708b of the photoresist layer 708 may be efficiently guided so as to move in the desired direction to the affected region 712 in the underlayer 706 which may later serve as a mask layer to facilitate transferring features to the underlying layers. Thus, the benefits of applying the electric field and/or magnetic field during the post-exposure baking process include enhanced control of the photoacid, quencher, ions, electron, and other charged species from the first portion 708b of the photoresist layer 708 to a desired location of the underlying layer, such as the underlayer 706, which may enhance the profile control of minimum line edge roughness, line width roughness, local critical dimension uniformity, critical dimension viability and nano-defect (such as resist scumming, line merge, line breaking, and the like) reduction. As a result, the device yield is improved.

In one example, the power supplied to control the electric and/or the magnetic field may be in continuous mode, pulsed mode, or a combination of mixed continuous and pulsed mode as needed.

Figure 7C:
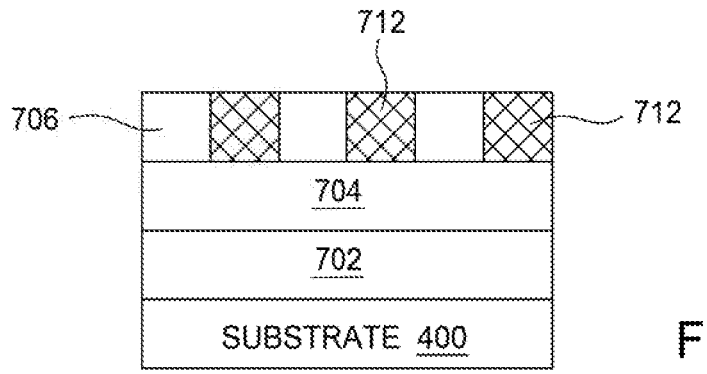
Figure 7D:
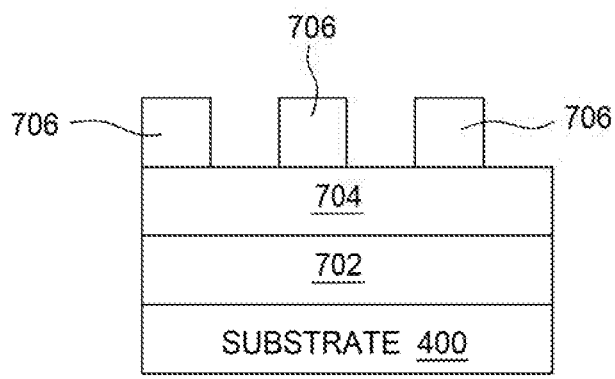

After the affected region 712 is formed in the underlayer 706, the photoresist layer 707 may then be removed from the substrate 400, as shown in FIG. 7C, by a first etching process. Subsequently, a second etching process may be performed to remove the affected region 712 from the substrate, forming a patterned underlayer 706, as shown in FIG. 7D. The patterned underlayer 706 with the desired profile control may then be further utilized as a mask layer to further transfer features into the underlying layers, eventually to the target layer 702 as needed with the desired profile control.

Figure 8:
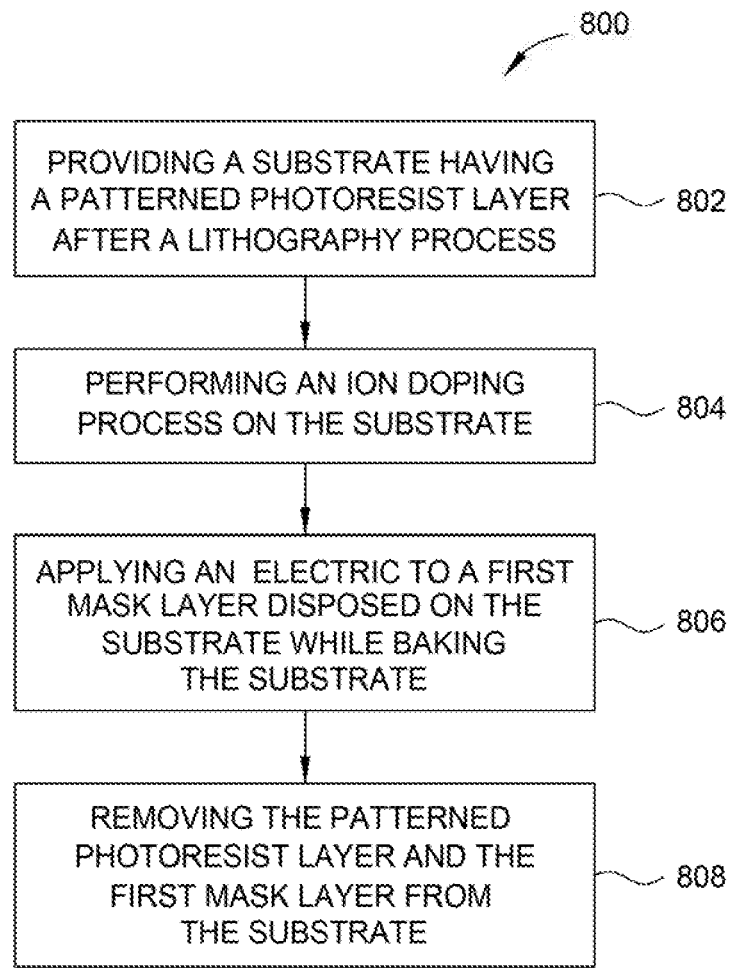
FIG. 8 is a flow diagram of one method of transferring features to a material layer disposed on a substrate.
Figure 9A:
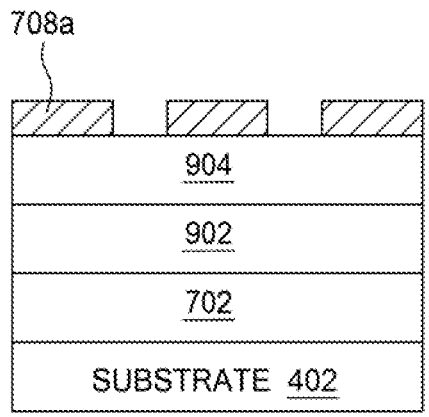
FIGS. 9A-9D are cross sectional views of a film stack disposed on a substrate during different stages of lithography process according to FIG. 8.

FIG. 8 depicts a flow diagram of a method 800 for utilizing electric field and magnetic field to assist controlling photoacid distribution/diffusion/directionality control in a photoresist layer during a pre- and/or post-exposure baking process. The method 800 begins at operation 802 by positioning a substrate, such as the substrate 400 described above, into a processing chamber, such as the processing chamber 200 depicted in FIGS. 2-3, with an electrode assembly and a magnetic assembly disposed therein. The substrate 400 has a top layer 904, a bottom layer 902 sequentially formed on a target layer 702, as shown in FIG. 9A. The material selection of the top layer 904 and the bottom layer 902 may be varied based on different lithography process requirements. In one example, the top layer 904 may be fabricated from a material similar to the underlayer 706 described above and the bottom layer 902 may be fabricated from a material similar to the hardmask layer 704 as described above. In one example, the top layer 904 is an organic material and the bottom layer 902 is an inorganic material.

In the example depicted in FIG. 9A, the photoresist layer 708 has been developed and patterned after the exposure process, leaving the patterned photoresist layer 708a on the substrate, as a mask structure for further patterning.

Figure 9B:
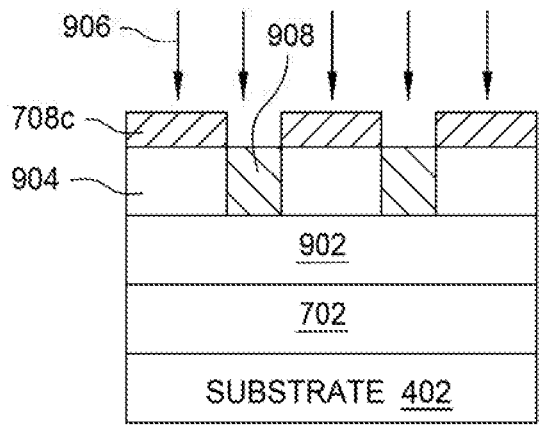

At operation 804, an ion implantation/doping process is performed to dope ions, as shown by the arrow 906, into the top layer 904, as shown in FIG. 9B. The ions are doped into a predetermined portion 908 of the top layer 904 exposed by the patterned photoresist layer 708a. The predetermined portion 908 then has the desired types of the ions/dopants formed therein, rendering film properties of the predetermined portion 908 different from the other portions of the top layer 904 without the ion treatment/dopants. Suitable gases that may be used to provide ions and/or species that may be doped into the top layer 904 include hydrogen containing gas, nitrogen containing gas, oxygen containing gas, helium gas and/or argon gas. The gases used may provide nitrogen ions, hydrogen ions, oxygen ions, helium or argon species to the top layer 904 to form a doped region at the predetermined portion 908 of the top layer 904. In one example, the doped region at the predetermined portion 908 of the top layer 904 includes dopant selected from at least one or more dopants selected from the group consisting of hydrogen dopants, oxygen dopants, nitrogen dopants, helium dopants and argon dopants. The ion implantation process may be performed in any suitable ion implantation process tool or plasma immersion process that may enable the ions to be penetrated and/or doped to a certain region of the top layer 904 exposed by the patterned photoresist layer 708a.

In one example, the ion implantation process is performed globally across the substrate 400, so that the patterned photoresist layer 708a is then densified with the dopants doped therein, forming the doped photoresist layer 708c on the top layer 904. The doped photoresist layer 708c may provide a good and robust protection of the top layer 904 formed thereon during the following patterning/etching process. Furthermore, the doped photoresist layer 708c may have a thickness between about 5% and about 25% less than the patterned photoresist layer 708a without the dopants doped therein.

Figure 9C:
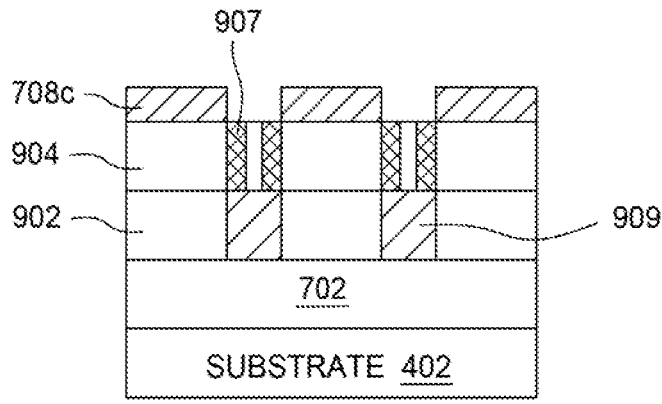

At operation 806, an electric field and/or a magnetic field may be individually or collectively applied to the processing chamber during the post-exposure baking process to control photoacid movement as well as the dopants from the ion implantation process at operation 804 further vertically down to the bottom layer 902, as shown in FIG. 9C. The photoacid and the dopants may be further drifted down to the bottom layer 902, forming an affected portion 909 with different film properties different from the film properties from the remaining portion of the bottom layer 902. The electric field and/or the magnetic field as applied while providing the thermal energy to the substrate (e.g., post-exposure baking process) may efficiently control the directions and/or movement of the photoacid as well as the ions/dopants from the predetermined region 908 of the top layer 904. Operation 806 may additionally or alternatively be performed as a pre-exposer baking process. By utilizing proper control of the electric field and the magnetic field applied during the pre- and/or post-exposure baking process, with the assistance from the thermal energy, the drifting directions and movement of the ions, dopants, photoacid, electrons, charged species, charged particles or other particles may be moved in desired locations of the underlying layers, so as to enhance the profile control of the mask layer in a following etching/patterning process.

It is noted that the electric field and/or the magnetic field may be applied simultaneous with, prior to, or after baking the substrate 400 as needed. As a result of the assistance provided by the electric field and/or a magnetic field during the pre- and/or post-exposure baking process, the photoacid movement in the photoresist layer may be efficiently controlled.

Figure 9D:
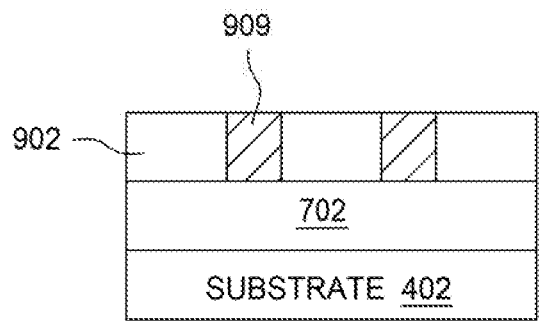

At operation 808, after the affected portion 909 is formed in the bottom layer 902, the doped photoresist layer 708c and the top layer 904 may be removed from the substrate 400, as shown in FIG. 9D, by one or more of etching/patterning processes. Though the example depicted in FIG. 9D still has the affected region 909 of the bottom layer 902 remaining on the substrate 400, it is noted that the affected region 909 may be removed by any suitable manner as needed to serve as a mask structure to assist further transferring features into the underlying target layer 702.

The previously described embodiments have many advantages. For example, the embodiments disclosed herein may reduce or eliminate line edge/width roughness with high resolution and sharp edge profile and enhance the accurate profile transfer and structure integrity control during the lithography process by an efficient directional control of the photoacid drifting/distribution with or without performing an ion implantation process prior to applying electric and/or magnetic field during a pre- and/or post-exposure baking process. The resultant features formed in the target layer may have a corner angle between 85 degrees and 95 degrees and a line width roughness less than 10 nm, such as between about 3 nm about 5 nm. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
    applying a photoresist layer comprising a photoacid generator on an underlayer disposed on a material layer disposed on a substrate, the material layer is an organic material, and the underlayer is an inorganic material;
    providing a first amount of thermal energy to the substrate in a pre-exposure baking process prior to and/or simultaneous with an application of a first electric field and/or a first magnetic field;
    exposing a first portion of the photoresist layer unprotected by a photomask to light radiation in a lithographic exposure process creating one or more channels in the photoresist layer;
    providing a second amount of thermal energy to the substrate and photoresist layer;
    applying a second electric field and/or a second magnetic field before, after, or simultaneous with performing a post-exposure baking process;
    wherein applying the first electric field and/or the second electric field and/or the first magnetic field and/or the second magnetic field comprises inducing movement of a photoacid in the photoresist layer in a vertical direction perpendicular to the substrate and/or in a longitudinal direction that is in a direction of the first magnetic field and/or the second magnetic field and parallel to a surface plane of the substrate and parallel to the channels in the photoresist layer; and
    drifting the photoacid from the photoresist layer into a predetermined portion of the underlayer under the first portion of the photoresist layer.

2. The method of claim 1, wherein applying the first electric field and/or the second electric field and/or the first magnetic field and/or the second magnetic field further comprises:
    controlling photoresist line edge roughness while performing the pre-exposure baking process and/or the post-exposure baking process.

3. The method of claim 1, wherein providing the thermal energy to the photoresist layer in the pre-exposure baking process and/or the post-exposure baking process further comprises:
    controlling a substrate temperature at a range between about 10 degrees Celsius and about 130 degrees Celsius.

4. The method of claim 1, wherein a first electric field strength of the first electric field and/or a second electric field strength of the second electric field is controlled between about 100 MV/m and about 2000 MV/m during the pre-exposure baking process and/or the post-exposure baking process.

5. The method of claim 1, wherein applying the first magnetic field and/or the second magnetic field further comprises:
    controlling the first magnetic field and/or the second magnetic field at a range between about 5 Tesla (T) and about 500 Tesla (T).

6. The method of claim 1, further comprising:
    removing the first portion of the photoresist layer to form openings in the photoresist layer;
    performing an etching process to remove the predetermined portion of the underlayer from the substrate, forming openings in the underlayer; and
    forming features in the material layer disposed under the underlayer, wherein the features have a corner angle between about 85 degrees and 95 degrees.

7. The method of claim 1, wherein the underlayer comprises one or more additives in an organic polymer solvent.

8. The method of claim 1, wherein a hardmask layer is disposed between the underlayer and the material layer.

* * * * *